United States Patent [19]

Scholz et al.

[11] Patent Number: 4,683,589
[45] Date of Patent: Jul. 28, 1987

[54] ELECTRONIC AUDIO SYSTEM

[75] Inventors: Donald T. Scholz, Wayland; Augustine Antoine, Dorchester, both of Mass.

[73] Assignee: Scholz Research & Development, Waltham, Mass.

[21] Appl. No.: 802,694

[22] Filed: Nov. 27, 1985

Related U.S. Application Data

[63] Continuation of Ser. No. 566,189, Dec. 28, 1983, abandoned.

[51] Int. Cl.$^4$ ............................................. H03G 3/00
[52] U.S. Cl. .................................. 381/61; 84/DIG. 4; 84/1.24
[58] Field of Search ...................... 381/61, 62, 63, 103, 381/98, 106; 84/1.24, 1.19, DIG. 26, DIG. 4

[56] References Cited

U.S. PATENT DOCUMENTS

| | | | |
|---|---|---|---|
| 4,180,707 | 12/1979 | Moog | 381/61 |
| 4,283,600 | 8/1981 | Cohen | 381/61 |
| 4,400,583 | 8/1983 | Bloy | 381/98 |
| 4,405,832 | 9/1983 | Sondermayer | 381/61 |
| 4,484,345 | 11/1984 | Stearns | 381/98 |
| 4,495,640 | 1/1985 | Frey | 381/61 |

Primary Examiner—Forester W. Isen
Attorney, Agent, or Firm—Wolf, Greenfield & Sacks

[57] ABSTRACT

An electronic audio signal processor circuit particularly suited for electrical instruments as an electric bass guitar for providng controlled distortion and tone alteration. The circuitry includes a compressor circuit at the input operated in conjunction with a detector which in accordance with the invention is an RMS detector. Also, at the input circuitry is a distortion switch which controls the type of distortion that is generated. This distortion switch is used in conjunction with a distortion amplifier, the output of which couples to a resistive sensing network. The network feeds the audio signals to a low EQ circuit, a mid EQ circuit and a high EQ circuit. Associated with the high EQ circuit is a clipper switch and at the output of the EQ circuitry is an EQ switch for providing a preferred predetermined frequency response wave forms. A high frequency compressor and associated switch is also associated with the EQ switch. The output circuitry includes a chorus circuit and associated chorus control switch. Appropriate mixing is provided at the output.

17 Claims, 13 Drawing Figures

MID EQ

Fig. 3C

LOW PASS

ELECTRONIC AUDIO SYSTEM

This application is a continuation of application Ser. No. 566,189, filed Dec. 28, 1983, now abandoned.

BACKGROUND AND SUMMARY OF THE INVENTION

The present invention relates in general to a device or system for altering an electrical audio signal. More particularly, the present invention relates to an electronic processing device preferably used with the bass guitar for producing controlled distortion of the audio output signal and for providing controlled enhancement of the tonal quality of the audio signal.

There are many prior art devices available which alter the tonal quality of electrical audio signals. For example, one prior art device has a distortion generator or a distortion compressor stage followed by a filter with a roll-off or attenuation with increased frequency, along with means to adjust either the amount (steepness) of the roll-off, or the point (knee) of the roll-off. However, the filter in such a device is very crude. Further, the adjustment means requires the operator to experiment with different settings or combinations of settings in order to define a desirable sound, and even then the device is limited in the quality of sound which it is capable of producing. Moreover, the arrangement just described does little if anything to tailor or enhance the character or quality of the tone of the signal produced by the distortion generator or compressor stage.

Reference is also made to co-pending application Ser. No. 420,280 filed Sept. 20, 1982, now U.S. Pat. No. 4,584,700, which describes an improved electronic audio signal processor. It is the purpose of the present invention to provide a circuit having some of the characteristics of this prior circuit but adapted in particular for use with a bass guitar.

Accordingly, it is an object of the present invention to provide an improved electronic audio signal processor system that is adapted to alter and improve the total quality of the audio signal.

Another object of the present invention is to provide an improved electronic audio system that is in particular adapted for use with a bass guitar or similar instruments having substantial low end audio signal content.

A further object of the present invention is to provide an electronic audio system in accordance with the preceeding objects and which also has means for providing controlled distortion of the audio signal.

A further object of the present invention is to provide an improved electronic audio signal system having means for controlling such parameters as sustain and attack.

To accomplish the foregoing and other objects, advantages and features of the invention, there is provided an electronic audio signal system for processing signals in the audio frequency range and comprising an input circuit means for receiving the audio signal. This input circuit means comprises a compressor and a detector means which is preferably an RMS detector. The use of an RMS detector circuit is in particular compatible with a musical instrument such as a base guitar. The use of an RMS detector overcomes previous problems associated with the use of a peak detector. The compressor preferably comprises a compressor operational amplifier. The input circuitry also includes a sustain control switch means and it is preferred that there be provided a feedback loop between the input and output of the compressor op amp including in the feedback loop the RMS detector and a pole of the sustain switch. The system of the invention also comprises a filter means comprising separate high EQ, mid EQ and low EQ filter circuits. The high EQ circuit comprises a plurality of separate filters. Similarly, the low EQ filter circuit comprises a plurality of separate filter circuits. There is also provided an EQ switch means coupled from the output of the low, mid and high frequency filter circuits for selectively establishing multiple frequency response wave forms. The EQ switch means preferrably has three positions and has its output coupled to a mixer circuit. There is also provided a volume control switch at the output of the aforementioned mixer.

In accordance with one feature of the present invention there is provided a high frequency compressor in addition to the input compressor circuit. The high frequency compressor has associated therewith a compressor switch for providing improved operation.

In accordance with another feature of the present invention there is provided peak clipping circuitry for providing instantaneous limiting. Clipping circuitry is used to remove transients above a predetermined threshold.

In accordance with another feature of the present invention thee is provided an improved chorus circuit which there is provided selective frequencies by means of separate filters along with a preferred inverter arrangement adapted to limit the amount of low frequency phase shift. This makes it easier to record on phonographic discs.

BRIEF DESCRIPTION OF THE DRAWINGS

Numerous other objects features and advantages of the invention should now become apparent upon a reading of the following detailed description taken in conjunction with the accompanying drawings in which.

DETAILED DESCRIPTION

Figure 1:
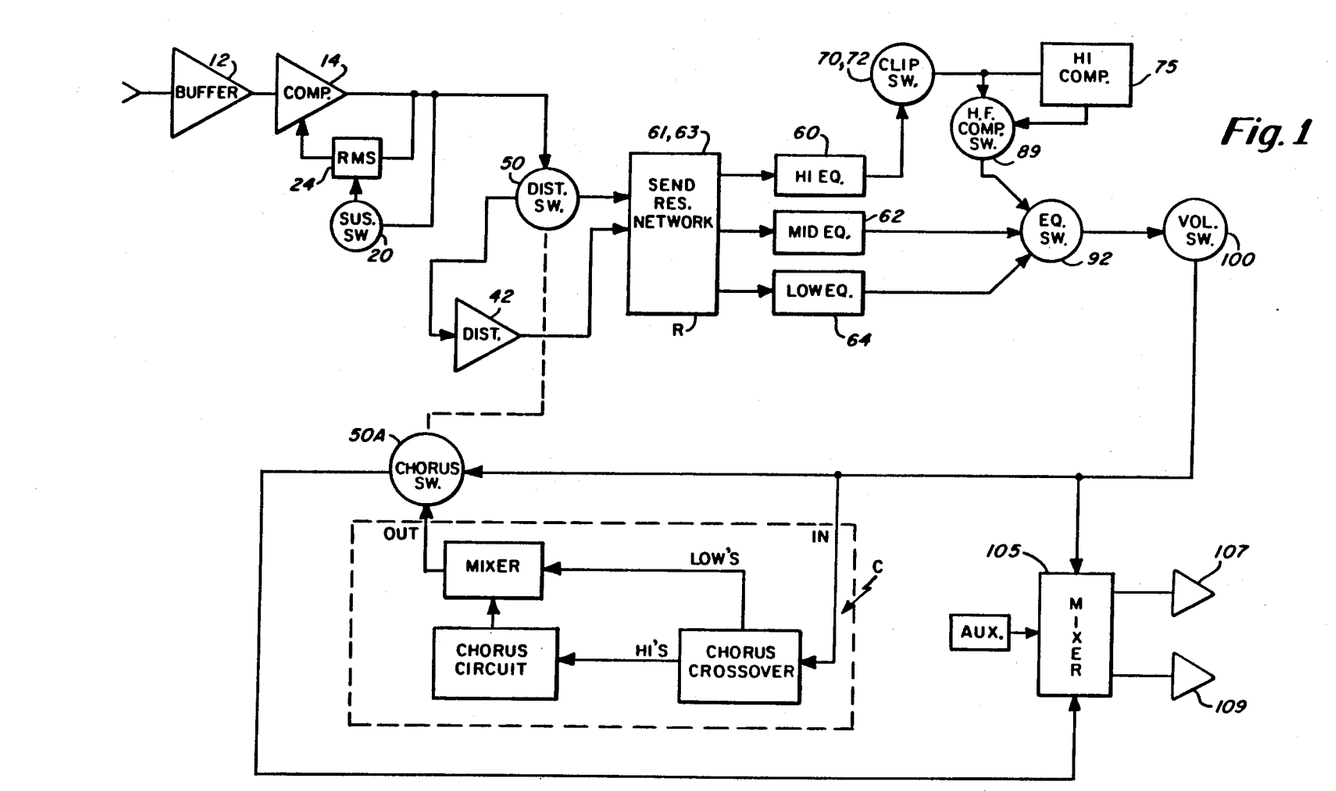
FIG. 1 is a block diagram illustrating the main parts of the electronic audio signal processing system of the present invention.

Reference is now made to FIG. 1 which shows an overall block diagram of the circuit of the present invention. Reference is also made to the details of the circuitry shown in FIGS. 2A-2E. Briefly, the circuit described in FIG. 1 includes an input buffer amplifier 12 for receiving the input audio signal. This signal is coupled to the compressor amplifier 14 and the output of the compressor op amp couples to the distortion amplifier 42. The output of the amplifier 42 couples directly to the resistor network R which includes a series of resistors shown in detail in FIG. 2. The block diagram also shows the RMS detector 24 which receives signals directly from the compressor op amp 14 and is used in the feedback manner as illustrated for the control of the amplifier 14. In this regard it is noted that there is also provided a sustain switch 20 having multiple positions and instrumental in controlling the output from the RMS detector which in turn controls the amplifier 14. The output of the compressor op amp 14 also coupled by way of a distortion switch 50 to the resistive network R.

The equalizer circuitry that is employed includes a high EQ circuit 60, a mid EQ circuit 62 and a low EQ circuit 64. Associated with the high EQ circuit 60 is a clip switch 72 having a clipping circuit associated therewith. The operation of the clipping circuit is described in further detail hereinafter. The output from the equalizer circuitry couples to the equalizer switch 92. The output from the clip switch 72 couples to the high frequency compressor switch 89. Similarly, the output of high frequency compressor 75 also couples to switch 89. The essential output from the EQ switch 92 couples to the volume switch 100 with the output from the volume switch coupling to the chorus circuitry C. Associated with the chorus circuitry C is a chorus switch 50A. Also illustrated in FIG. 2 is the mixer 105 and associated output drivers 107 and 109. The description of FIG. 1 has been brief because more detail now follows of the detailed circuitry used in constructing a preferred embodiment of the circuit of the present invention.

FIG. 2 shows the details of a preferred circuit in accordance with the present invention. This circuit includes at its input terminal 10, a buffer amplifier 12 which is an operational amplifier. Between the input terminal 10 and the buffer amplifier 12 there is provided an input circuit 11. The circuit 11 includes resistors R101 and R179 and capacitors C101 and C134. This input filter circuit provides a degree of pre-emphasis providing attenuation of low frequency signals.

Figure 2A:
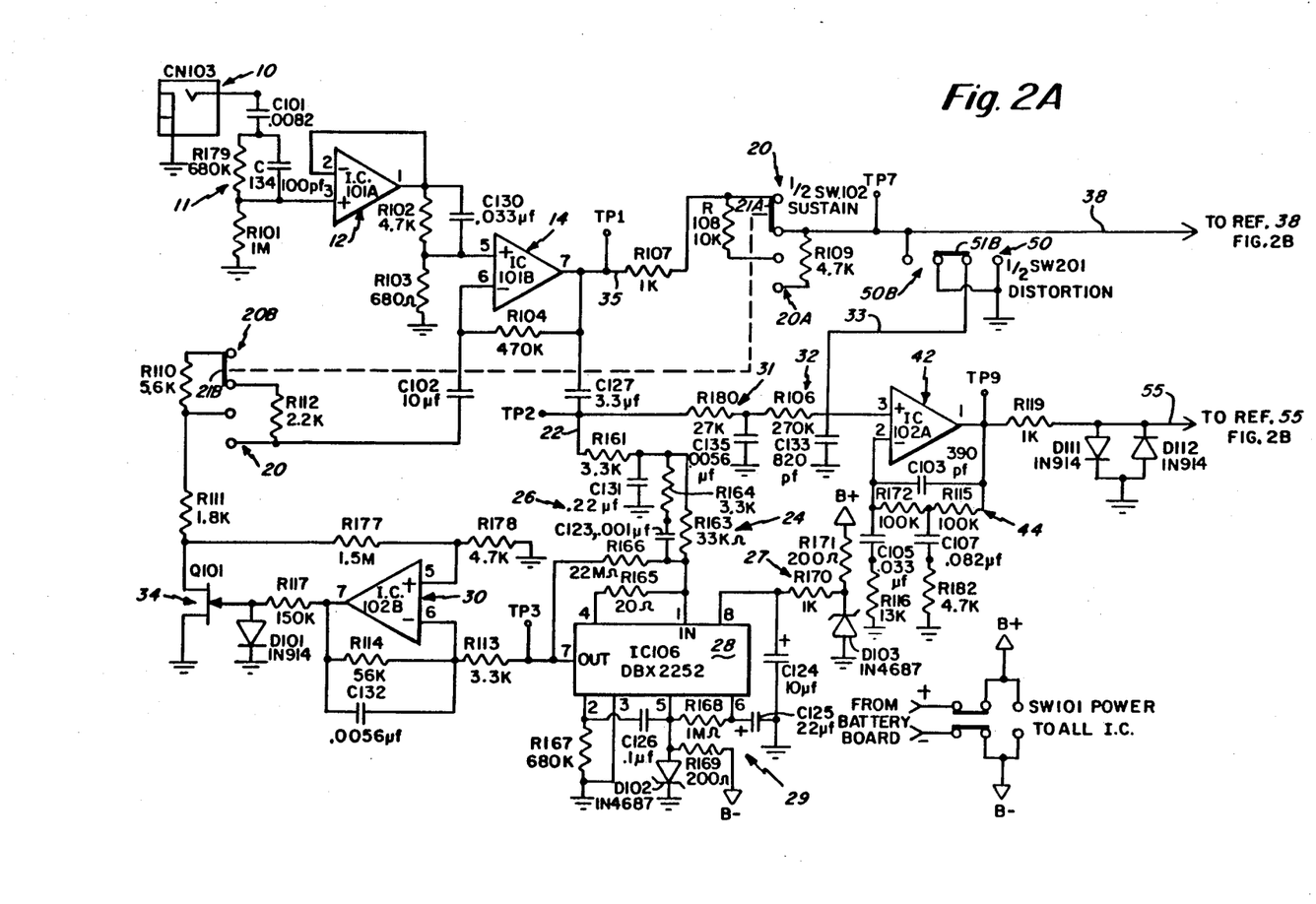
FIGS. 2A-2E show the details of the preferred circuit of the present invention as illustrated in the block form in FIG. 1.

At the output of the operational amplifier buffer 12, there is provided a circuit which includes resistors R102 and R103 coupled in series with a capacitor C130 coupled across the resistor R102. This output circuit from the amplifier 12 attenuates the output signal from the buffer 12 and couples signal to the compressor operational amplifier 14. The circuit including resistors R102 and R103 along with capacitor C130 provides high frequency pre-emphasis primarily by means of capacitor C130.

The compressor op amp 14 has a resistor R104 coupled between its input and output. The resistor R104 controls the gain of the amplifier 14. The gain of the amplifier 14 is furthermore controlled by a resistance coupled to the inverting input of the amplifier through the sustain switch 20, and through at least resistor R111 and field effect transistor 34 to ground. The output of the operational amplifier 14 couples by way of capacitor C127 and line 22 to the input of the RMS detector 24. The input to the RMS detector 24 is essentially at the resistor R161. This input circuit to the RMS detector chip 28 also includes the resistors R163, R164, R165 and R166 and capacitors C123 and C131. At least part of these components comprise a filter for attenuating high frequencies to the input of the RMS detector chip 28.

The aforementioned input circuit 26 is coupled from the junction between resistor R161 and capacitor C131. This RC network functions as a low pass filter. The circuit 26 which includes resistors R163 and R164 along with capacitors C123 and C131 provides and input voltage-to-current converter. The source impedance of the circuit 26 is less than 10 k ohms at a frequency of 100 KHZ for providing stability. The input node at pin 1 to the RMS detector circuit chip 28 is a virtual ground, accepting an input current only. AC coupling provided by capacitor C127 prevents any DC offset at the input to circuit chip 28 from obscuring any low level AC signals. The circuit 28 is preferably an RMS detector chip of type DBX 2252.

As part of the RMS detector 24, there is also provided a circuit 27 which provides for basic power supply operation in connection with the detector chip 28. The circuit 27 includes resistors R170 and R171, capacitor C124 and Zener diode D103. The circuit 27 couples to pin 8 of the detector chip 28.

In addition, there is also provided another circuit associated with the detector chip 28 identified in the detailed drawing as circuit 29. This circuit includes resistors R167, R168 and R169, capacitors C125 and C126 and Zener diode D102. The resistor R167 is used to adjust the output of the RMS detector chip for a zero reference output. The actual output from the detector circuit chip 28 is taken at pin 7 and this output couples to the signal input of the amplifier 30. The output at pin 7 from the circuit chip 28 actually couples by way of resistor R113 to one of the inputs of the operational amplifier 30. A resistor biasing network establishes the voltage at the other input to the amplifier 30. This resistive network includes resistors R177 and R178 connected in series from FET transistor 34 to ground.

The output of the amplifier 30 couples by way of resistor R117 to the diode D101 and also to the control electrode of the FET transistor 34. It is also noted that coupled between the input and output of the amplifier 30 is an RC network comprised of resistor R114 and capacitor C132. The voltage at the output of the amplifier 30 is an amplified DC level signal corresponding to the value of the RMS signal coupled to the RMS detector circuit 24.

As mentioned previously, the output of the amplifier 30 couples to the FET transistor 34 which is preferably of type 2N4340. This feedback control from the RMS detector chip 28 controls the conduction of the FET transistor 34 and thus the resistance to ground through the sustain switch 20. The sustain switch 20 has multiple positions which provide for different resistive combinations as far as resistors R110 and R112 are concerned. The resistor R111 is connected in series between resistor R110 and the source and drain of FET transistor 34. Reference will be made hereinafter to the modes of operation of the sustain switch 20.

With regard to the operation of the FET transistor 34, it is noted that for high level signals the FET transistor receives a high voltage which tends to reduce the gain of the amplifier 14. As the output of the RMS detector increases, the resistance of the FET transistor 34 also increases thus reducing the gain in a feedback manner. For low level input signals, the FET transistor 34 essentially functions as a linear amplifier providing high gain to the amplifier 14.

When a note is first struck, there is a substantial amount of both high and mid band frequencies along with the fundamental. After a short period of time, the high and mid band frequencies are damped. This tends to signal the RMS detector to control the FET transistor 34 to its high resistance state. Without the provision for the filtering provided by resistor R161 and capacitor C131, the FET transistor goes to its high resistance state causing low gain at the operational amplifier 14. However, when the signal damps out the RMS detector has its output decreased and the FET transistor then goes to a lower resistance state increasing the gain at the amplifier 14. Thus, without the use of the aforementioned filter the RMS detector is controlled to give increased gain derived from high and mid frequencies. However, with the use of the low pass filter comprised of resistor R161 and capacitor C131 the compressor op amp 14 does not respond quickly to high frequency signals. This forces the gain of the amplifier 14 to change basically only with changes in the fundamental frequency as is desired in accordance with the invention.

It is also noted in connection with the RMS detector circuit 24 that the release time of the note can be controlled and is basically controlled by means of the capacitor C125 and resistor R168. These components form part of the aforementioned circuit 29. It is preferred to have the attack time within a desired range. The attack has to be sufficiently slow to allow at least one period of the lowest fundamental. This may be any frequency on the order of 40 Hz. This is desired so that there is no attenuation for the first cycle or so of the fundamental and thus no attendent gain reduction in the compressor op amp 14. However, if the release time is too slow there is not sufficient recovery of the FET 34 to return to its low level before the next note is hit. The release time also has a limit on its upper end because if the release time is made too short then there may be caused a harmonic distortion. This distortion causes amplitude modulation of the higher frequency components at frequencies of the fundamental and of low harmonics. The preferred range of released time is 50-150 dB/sec.

The sustain switch 20 referred to hereinbefore basically has three positions and in the detailed drawing it is illustrated as having two separate poles 20A and 20B. Each pole is also illustrated as having its respective movable contact 21A, 21B. With respect to the pole 20B, the movable contact 21B is in its upper position as illustrated and the conduction path is a series path through resistors R110, Rlll and R112. This thus represents the maximum resistance setting of pole 20B which in turn corresponds to a minimum sustain condition. This maximum resistance position is associated with a minimum gain position of the compressor op amp 14.

In the mid position of the contact 21B of the pole 20B, the resistor R112 and the Resistor Rlll are in the circuit but the resistor R110 is essentially out of the circuit. This provides for a decreased resistance and an associated increased gain (primarily for low level signals) providing increased sustain. Finally, in the lowermost position of the contact 21B both resistors R110 and R112 are out of the circuit and the path of conduction is through resistor Rlll only. In this position there is a minimum resistance that corresponds to a maximum gain (primarily for low level signals) and a maximum sustain.

The output of the compressor op amp 14 couples by way of line 35 to resistor R107 and in turn to the other pole 20A of the sustain switch 20. It is noted that there is also provided a resistor R108 coupling between two of the four fixed contacts of the pole 20A, as illustrated. Also, there is provided a resistor R109 associated with the pole 20A also coupling between a fixed contacts as illustrated. The two poles 20A and 20B are operated together and in this regard the associated movable contacts 21A and 21B are ganged together. In the uppermost position of the pole 20A the output of the amplifier 14 couples by way of resistor R107 directly to the output line 38. The signal on the line 38 is the main signal that couples to the equalizer circuitry to be described in detail hereinafter. In the mid position of the contact 21A, the output of the amplifier 14 couples in series with both resistor R107 and resistor R108 to the output line 38. Finally, in the lower most position of tne contact 21A, there is a maximum resistance position in which all three of the resistors R107, R108 and R109 are in series between the output of the amplifier 14 and the aforementioned output line 38.

The pole 20A of the sustain switch 20 essentially provides for different levels of attenuation as a function of the different positions of the associated pole 20B so that, for example, in the top position of the contacts 21A and 21B, corresponding to minimum gain and minimum sustain, there is little attenuation because only resistor R107 is in the circuit. At the higher gain positions the additional resistance is added in, first by the resistor R108 and then by the addition of the resistor R109 depending upon the switch positon. The pole 20A with its associated resistors R108 and R109 helps to compensate for the reduced output at the beginning of a note which occurs when the pole 20A is in its mid or upper (low sustain) position. A slightly lower level occurs at the start of the note when in these reduced sustained settings due to the fact that the resistors R110 and R112 do cause a slight but measurable gain reduction even at fairly high input signal levels, although, their main effect is to lower gain at low signal levels.

Thus, the output of the amplifier 14 couples by way of line 35 to the sustain switch pole 20A, also couples by way of line 22 to the RMS detector circuit 24 and furthermore is illustrated in the detailed diagram as having this output coupled by way of RC filters 31 and 32. The output of the filter circuits couples directly to a further operational amplifier 42 forming part of a filter circuit along with RC filter 44. The input filter circuits 31 and 32 comprise, respectively, resistor R180 and capacitor C135; and resistor R106 and capacitor C133. The filter 44 includes capacitors C103 and C107 and resistors R115, R116 and R172. At the output of the amplifier 42 there is also provided a further resistor R119 coupling to diodes Dlll and D112.

The filter circuit 31 and the filter circuit 32 are both band pass filters providing a roll-off at approximately 500 Hz. Because of the aforementioned pre-emphasis at the input to the buffer amplifier 12 it is desired to provide additional roll-off as provided by the filter circuits 31 and 32. This has the effect of reducing the high frequency signals coupled to the input of the distortion amplifier. In addition, the distortion amplifier 42 also has associated therewith a low pass filter circuit 44 previously mentioned. The filter circuit 44 is preferably primarily a band pass filter centered at about 300 Hz.

It is also noted that the output of the filter 32, in addition to coupling to the distortion amplifier 42, also couples by way of line 33 to one of the fixed contacts of the distortion switch 50. It is noted that the distortion switch 50 also has a chorus control function and in this regard it is provided with two poles 50A and 50B. The operation of the distortion switches will be discussed in further detail hereinafter.

The output of the amplifier 42 as mention previously, couples by way of resistor R119 to diodes Dlll and D112. The diodes Dlll and D112 provide a clipping action. The signal is fed from these diodes to the RC network 52 which is comprised of two separate RC filter poles including a first circuit of resistor R174 and capacitor C128 and a second circuit of resistor R175 and capacitor C129. These filter circuits form a low pass filter with the output thereof coupling by way of line 53 into the EQ mixer circuitry to be described hereinafter.

The distortion switch 50 as mentioned previously, has two separate poles 50A and 50B. These poles also have respective movable contacts or wipers 51A and 51B. The pole 50A has a chorus function to be described in detail hereinafter. The switch pole 50B carries out the primary distortion control. With regard to the pole 50B, the switch essentially has three positions with two positions being "off" and one position being an "on" position. In the detailed circuit diagram the movable contact 51B of the switch is shown in its mid, "off" position. In this position it is noted that the contact 51B is essentially coupled to ground and thus the signal on the output line 55 is essentially grounded out. In this regard, note the ground signal coupling by way of the contact 51B and line 33 to the distortion amplifier 42. The line 55 previously mentioned couples to the high EQ and mid EQ circuitry to be described later. In the left most position of the contact 51B of switch pole 50B, the output line 38 is grounded. However, in that position the output from the distortion circuit couples directly to line 55 and to the high and mid EQ circuitry. Thus, in the leftmost position of the contact 51B the line 33 is essentially open circuited.

In the righmost positon of the contact 51B of the switch pole 50B, the line 55 is also grounded. A further discussion is found hereinafter in connection with the chorus switch pole 50A which is ganged with the distortion switch pole 50B; being ganged for joint action by virtue of ganging between the movable contacts 51A and 51B. In both of the "off" positions of the switch pole 50B there is no signal coupled to the output line 55 because the input to the amplifier 42 is grounded by virtue of a ground from the distortion switch pole 50B.

Figure 2B:
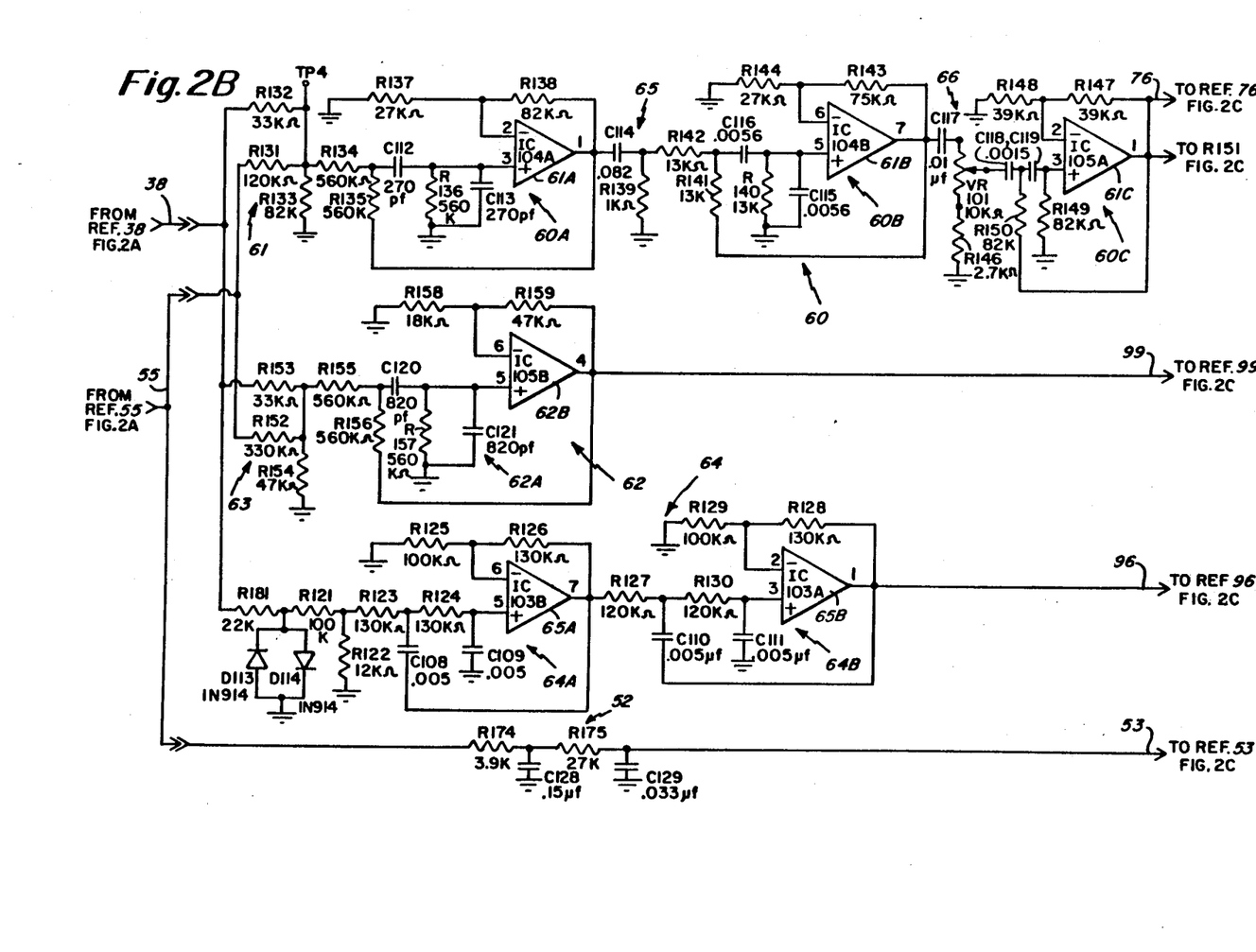

The detailed circuit diagram also shows the aforementioned equalizer circuitry which includes a high EQ circuit 60, a mid EQ circuit 62 and a low EQ circuit 64. Each of these EQ (equalizer) circuits comprise filters. Thus, the circuit 60 is comprised of filters 60A, 60B ano 60C. The filter 60A comprises an RC network and amplifier 61A and similarly, the filter 60B comprises an RC network and amplifier 61B. The filter 60C also comprises an RC network and an amplifier 61C. The amplifier 61A has associated therewith a biasing network which is comprised of resistors R137 and R138. Similarly, the amplifier 60B also has a biasing network which is comprised of resistors R143 and R144. Finally, the amplifier 61C has biasing network comprised of resistors R147 and R148. The network 60A has an input filter which is comprised of at least resistors R134-R136 and capacitors C112 and C113. The network 60B has an input filter network comprised of resistors R140-R142 and capacitors C115 and C116. The network 60C has an input filter comprised of resistors R149 and R150 and capacitors C118 and C119.

The mid EQ circuit 62 is also comprised of a filter 62A. This filter network comprises an amplifier 62B and an input filter network which is comprised of at least resistors R155-R157 and capacitors C120 and C121. The amplifier 62B also has a biasing network comprisec of resistors R158 and R159.

The low EQ circuit 64 is also comprised of filters including filters 64A and 64B. The filter circuit 64A includes an amplifier 65A and an input filter circuit including at least resistors R123 and R124 and capacitors C108 and C109. Also included is a biasing network associated with amplifier 65A and which includes resistors R25 and R26. Similarly, the network 64B includes an amplifier 65B and an input filter network comprised of at least resistor R130 and capacitors C110 and Clll. There is also provided a biasing network associated with the amplifier 65B which includes resistors R128 and R129. At the input to the networks 64A and 64B is provided a clipping network including diodes D113 and D114. These diodes are in reverse polarity and are tied to ground. The opposite side of the pair of diodes couples to a resistor network including resistors R181 and R121. The resistor R181 ties to the aforementioned line 38. Line 38 also couples to resistors R132 and R153 associated with the high and mid EQ circuits, respectively.

With regard to the aforementioned filters, the filter networks 60A and 60B are constructed as band pass filters. The filter 60A is centered at about 1.5 KHz and the filter 60B is centered at about 3.0 KHz. The filter 60C is a high pass filter and is 3 db down at 1.5 KHz. The filter 62A of the mid EQ circuit is a band pass filter centered at about 490 Hz. In the low EQ circuitry the filter 64A and as well as a filter 64B are both low pass filters at a similar filtering characteristics to be described hereinafter.

The aforementioned signal lines 38 and 55 coupled to both the high EQ circuit 60 and mid EQ circuit 62. With regard to the high EQ circuit 60, it is noted that at the input thereto there is a mixer circuit 61 for receiving the signals from lines 38 and 55. The mixer circuit 61 is comprised of R131, R132 and R133. The line 38 couples to the resistor R132 and a line 55 couples to the resistor R131. Both of these resistors tie at their other end in common to the resistor R133.

Similarly, at the input to the mid EQ circuit 62 there is also provided a mixer circuit 63 which is comprised of resistors R152, R153 and R154. The line 38 couples to resistor R153 and the line 55 couples to resistor R152. The other side of both of these resistors tie in common to the resistor R154. In both of the mixer circuits 61 and 63 the respective resistors R133 and R154 are coupled to ground.

The output of the mixer 61 couples by way of resistor R134 to the filter 60A. Similarly, the output of the mixer 63 couples by way of resistor R155 to the filter 62A.

With regard to the high EQ circuit 60, it is also noted that there is one additional circuit between each of the filters. Thus, between the filter 60A and the filter 60B there is provided a circuit 65 which is comprised of capacitor C114 and resistor R139. There is also provided another circuit 66 coupled between the filter 60B and the filter 60C. This circuit includes capacitor C117, resistor R146 and potentiometer VR 101. The movable contact of the potentiometer couples into the filter circuit 60C at the capacitor C118.

In connection with each of the filters forming the equalizer circuits, each of the input RC networks forming part of the filter is basically of conventional construction as indicated by way of example, the filter 60B includes an operational amplifier 61B having gain control resistors R143 and R144 along with an input RC circuit that includes a resistor R140, resistor R141 and capacitors C115 and C116. The resistors R143 and R144 control the Q of the circuit.

Figure 3A:
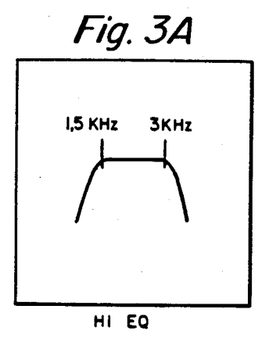
FIGS. 3A-3C illustrate frequency response curves associated with the high, mid and low eq circuits.
Figure 3B:
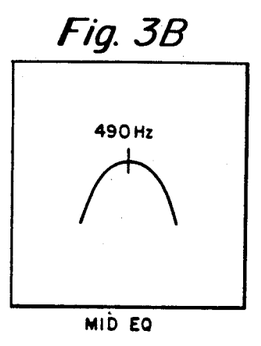
Figure 3C:
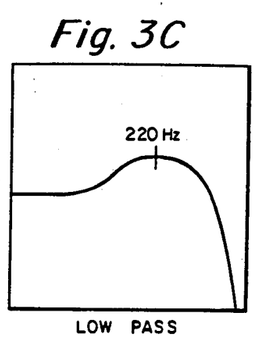

Reference is also now made to separate filter diagrams shown in FIG. 3. In FIG. 3A the response curve is taken at the output of the filter 60C. This curve shows a flat response between 1.5 KHz and 3.0 KHz. The response curve in FIG. 3B is taken at the output of filter 62A and shows a mid frequency pass band centered at 490 Hz. Finally, the curve shown in FIG. 3C illustrates the low pass response and is taken at the output of the filter 64B. It is noted that the curve in FIG. 3C has a hump just before the roll off at about 220 Hz.

Figure 2C:
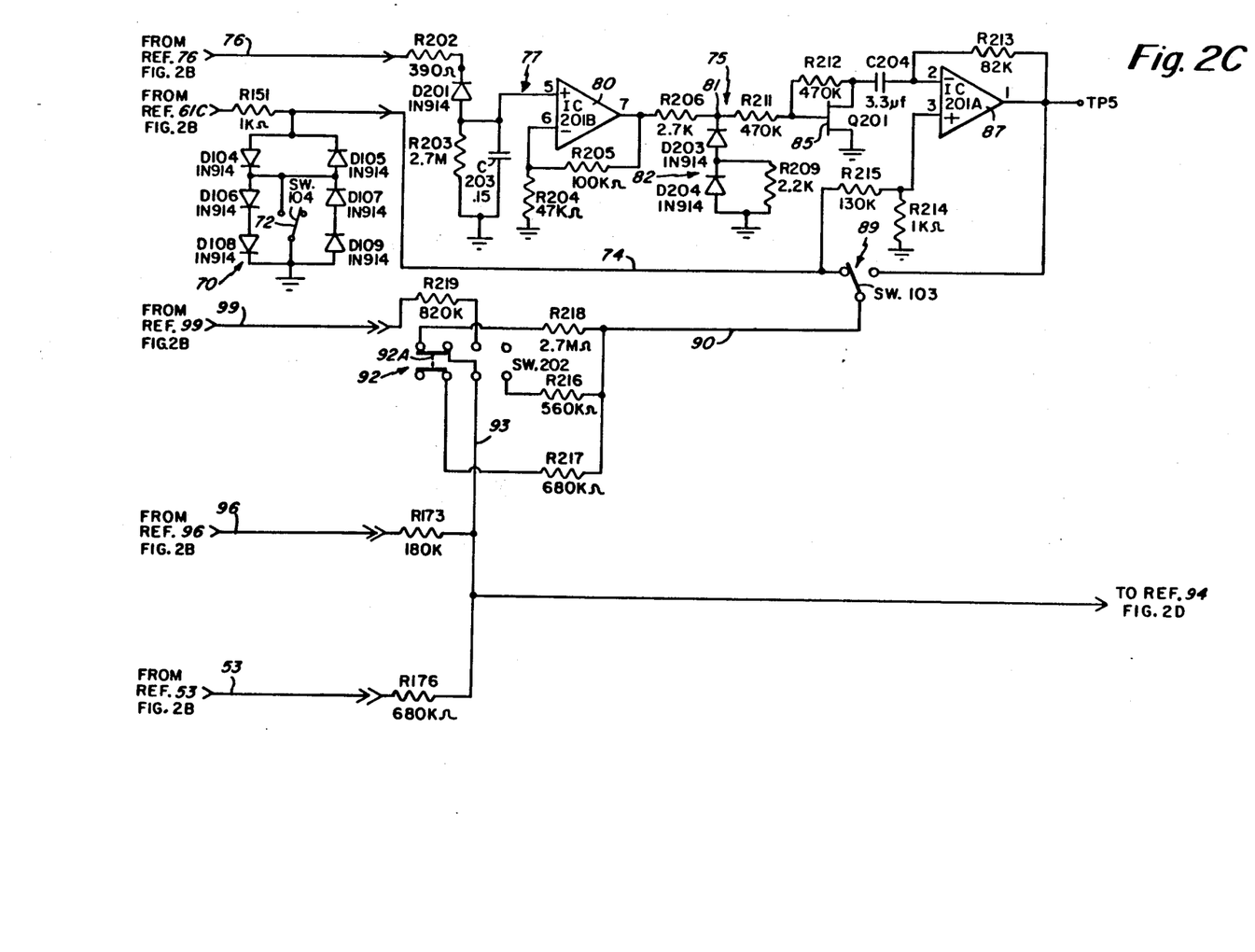

The output of the filter 60C which comprises part of the high EQ circuit 60, couples by way of resistor R151 to the diode network 70 which is comprised of diodes D104–D109. The circuit also shows a clipper switch 72 which is a two position switch. In the position illustrated in the drawing all six of the diodes of the network 70 are in the circuit. When the switch 72 is moved to the alternate position then only diodes D104 and D105 are in the circuit, all of the other diodes having been bypassed to ground. Thus, the circuit 70 provides for two different modes of clipping. In one mode of operation, the clipping occurs at 0.6 volts while in the other mode of operation with all diodes in the circuit the clipping occurs at 1.8 volts. The output from this circuit is coupled by way of line 74 to the high frequency compressor 75. It is noted that there is also an output directly from the filter 60C by way of line 76 to the peak detector 77 of the high frequency compressor 75. More particularly, the output on line 76 couples by way of resistor R202 and diode D201 to the peak detector circuit 77 which includes, in addition to the diode D201, the resistor R203 and the capacitor C203. The detector 77 also includes an operational amplifier 80 with associated resistors R204 and R205. The output of the operational amplifier 80 couples to a resistor R206. At the node 81 between these resistors the signal couples to a diode network 82 which is comprised of diodes D203 and D204 along with resistor R208 and R209. The network 82 is a logarithmic approximator. The signal at the node 81 also couples to an FET transistor 85 by way of the resistor R211. There is also provided a second resistor R212 coupled between the gate and one of the output electrodes of the transistor 85. The transistor 85 is used to control the gain of the high frequency compressor op amp 87.

The op amp 87 has at its input a resistor network including resistors R214 and R215. At the output of the op amp 87 there is provided a high frequency compressor switch 89. The switch 89 in the position illustrated couples the signal on line 74 directly from the clipper circuit 70 to the output line 90. In the alternate position of the switch 89, the signal on line 74 is coupled through the high frequency compressor op amp 87 to the output line 90. The output line 90 couples to the EQ switch 92.

The peak detector circuit 77 operates to charge the capacitor C203 to the peak of the signal coming on the input line 76 from the filter 60C. The release time or discharge time constant of the capacitor C203 is determined by the value of the resistance of resistor R203. It is noted that the resistor R203 is of relatively large value. This provides a large discharge time constant. In this way the circuit responds essentially only to the first peak of the wave form. The discharge time constant is also tailored so as to be greater than the normal release time of the instrument. The amplifier 80 then amplifies the detected peak signal and couples this to the logrithmic approximator circuit 82.

For low level signals the network 82 is essentially out of the circuit. On the other hand for high level amplitude signals the diode D203 become forward biased and thus inserts the resistor R209 into the circuit providing for greater attenuation of those level signals. For even higher level signals the diodes D203 and D204 become forward biased forming a very low resistance path to ground providing for even greater attenuation of those high level signals. This output is then fed to the control FET 85.

In accordance with one feature of the present invention reference is made to the aforementioned clipping circuit 70 which is comprised of diodes D113–D114. These diodes reduce any distortion developed in the compressor circuit, reducing in particular third harmonic distortion that may be generated by the FET 34. This clipping action operates in conjunction with gain provided at a later stage in associated with the volume switch 100. The inclusion of these diodes allows an increase in gain at the volume switch. These diodes even out any unevenness derived from the player signal. The clipping essentially provides a uniformity in the fundamental.

It is also noted that the clipper circuit 70 is provided at the output of the high EQ circuit 60. If it had been provided at the input instead there would be a clipping of the low and mid frequencies generating harmonics that would be passed by the high EQ circuit and are by their nature undesirable. By putting the circuit at the output of the filters the harmonics generated fall outside of the pass band formed by the high EQ circuit and can thus be filtered later without affecting signals in the desired frequency range. Also, the use of the clipper circuit provides an improved signal to noise ratio.

In summary, the clipper circuit 70 has the following advantages. First, any transient at the beginning of the note is regulated and made more uniform so as to match transients in the other equalizer sections particularly the low frequency section. Second, there is a reduction in the initial transient of the high frequencies so that less high frequencies occur at the start of the note. Third, there is an improved signal to noise ratio which allows all of the amplifiers such as amplifier 61A–61C to be driven harder. The clipper circuit 70 essentially cleans up the signal at the output of the filters.

A similar diode arrangement is also used in conjunction with the low EQ circuit 64. This includes the diodes D113 and D114 (see FIG. 2B). This clipper circuit provides for the initial node to be more uniform. Non uniformity occurs due to human playing and also because of the physical limitations on the compressor. These diodes give you increased output level without causing clipping in the output amplifiers or the users subsequent amplifier equipment. The filters 64A and 64B remove high frequency harmonics generated by diodes D113 and D114.

Figure 4A:
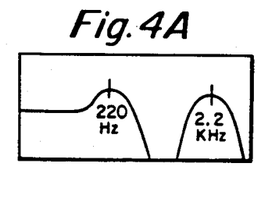
FIGS. 4A-4C show frequency response curves as they appear at the output of the eq switch depending upon switch position.

The EQ switch 92 as with the other switches previously described has three positions and has a movable contact 92A which is shown in its left most position corresponding to a "fat" mode of operation. In this position it is noted that a signal couples on line 90 by way of the high resistance resistor R218 to the line 93 and from there to the input of the EQ mixer 94. It is also noted that the signal on line 90 by way of resistor R217 is terminated and does not couple to any part of the circuitry by way of the switch 92. However, either signals on line 96 or line 53 couple by way of respective resistors R173 and R176 to the input of the EQ mixer 94. Thus, the mixer 94 provides a waveform which is a combination of low pass filtered signals and a highly attenuated signal from the high pass compressor circuit 75; the high attenuation being carried out by means of the high value resistance of resistor R218. In this connection refer to FIG. 4C which shows the associated frequency response.

Figure 4B:
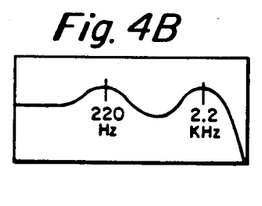
Figure 4C:
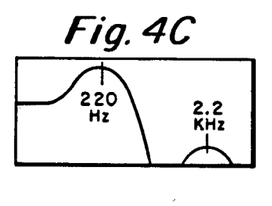

In the mid position of the switch 92 the signal on line 99 from the filter 62A couples by way of resistor R219 to line 93 anc from there to the EQ mixer 94. Also, the signal from the high frequency compressor circuit 95 at line 90 now couples by way of resistor R217 which is a lower value resistor to line 93 by way of one of the sets of contacts of the switch 92. It is also noted that signals from either lines 53 or 96 also couple directly into the EQ mixer 94, these signals coupling into the mixer regardless of the position of the switch 92. Reference can also now be made to FIG. 4B which shows the frequency response associated with this mid range position.

In the left most position that is illustrated the signal on line 99 by way of resistor R219 is essentially terminated at the switch. This means that there is no mid band essentially. In this regard refer to FIG. 4A which illustrates the frequency response. However, it is noted that in addition the low frequency signals passed by way of either line 53 or line 96, the output from the high frequency compressor 75 at line 90 couples by way of resistor R216 to the line 93 coupling to the input of the EQ mixer 94. It is noted that the resistor values of resistors R216–R218 are selected so that in this right most position there is a minimum attenuation as is apparent from the diagram of FIG. 4A particularly as compared with the diagram of FIG. 4C.

The EQ mixer 94 has coupled between its input and output a resistor R221 and capacitor C205. The resistor R221 controls the gain of the mixer amplifier and the capacitor C205 is instrumental in controlling frequency response particularly increasing the roll off of the high frequency signal.

The output of the EQ mixer 94 couples to a resistor network comprised of resistors R222 and R223. These resistors have associated therewith a volume switch 100 which is a two position switch. This provides for high-low volume control. In the position illustrated the switch is in its high volume position. By moving it to the opposite position, resistor R223 is then put into the circuit and this increases the resistance so that the switch is thus in its low volume position.

The output of the resistor network associated with the volume control switch couples to a volume op amp 102. This amplifier 102 functions similarly to the mixer amplifier 94 and has associated therewith a resistor R224 and a capacitor C206. The resistor R224 is instrumental in controlling the gain of the amplifier and the capacitor C206 operates similarly to the capacitor C205 in controlling high frequency response roll off.

Figure 2D:
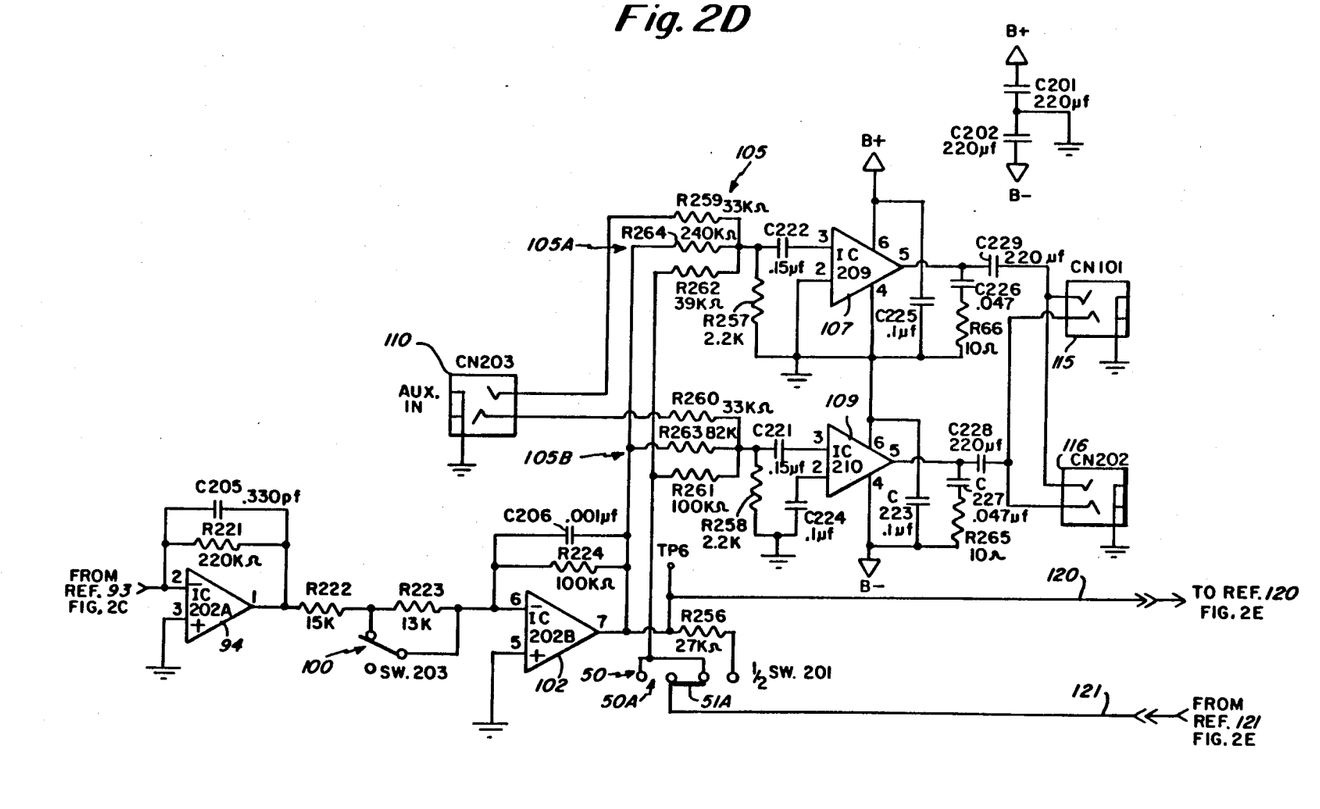
Figure 2E:
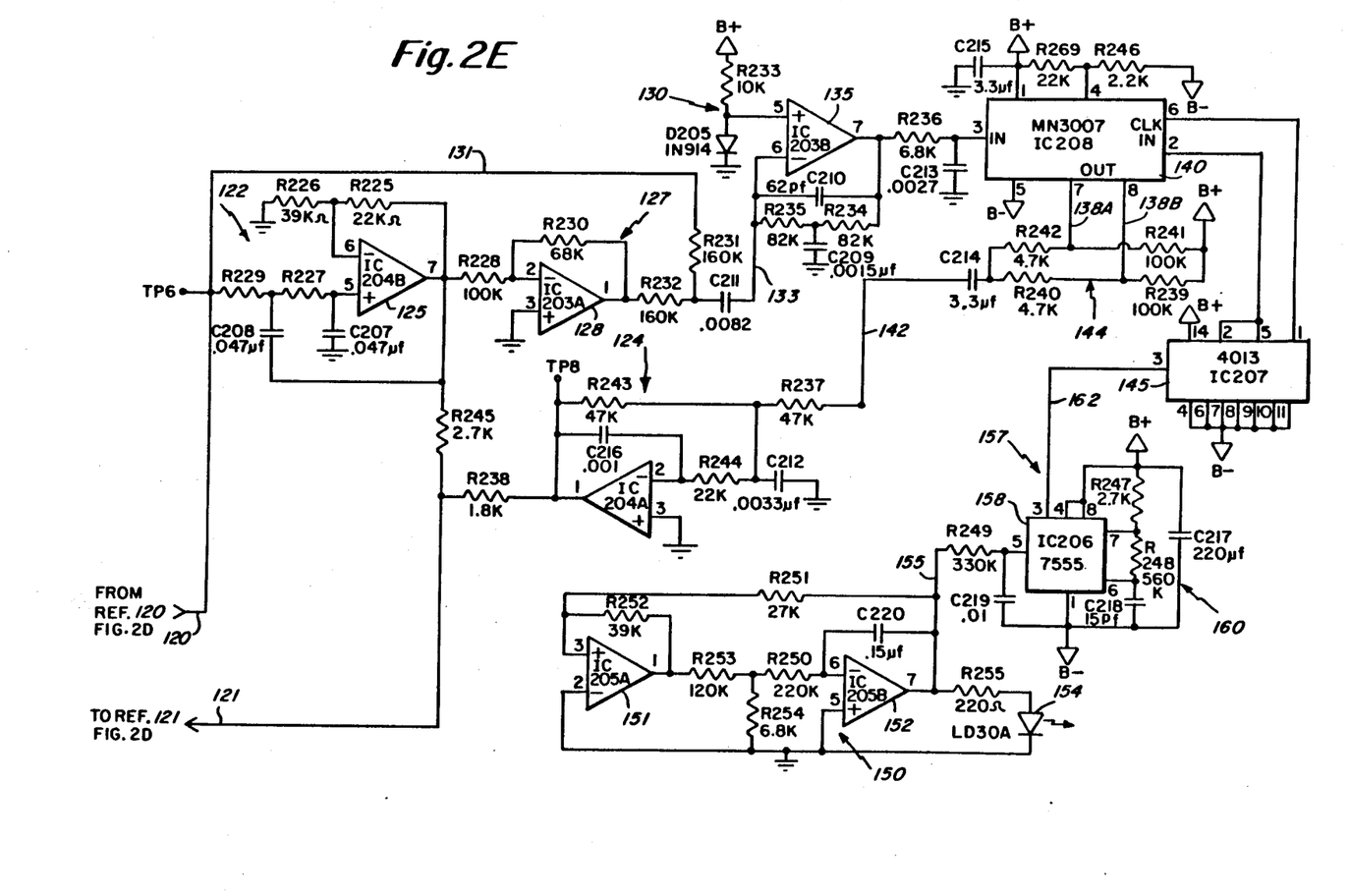

The detailed diagram also illustrates a mixer circuit 105 which is comprised of separate channels 105A and 105B. Each of these channels includes three input resistors. For example, channel 105A has resistors R259, R262 and R264. The channel 105B has mixer resistors R260, R261 and R263. The channel 105A also has a power amplifier 107 and the channel 105B has a power amplifier 109. It is also noted that there is an auxilliary input at the input jack 110. With regard to the channel 105A the output from the auxilliary jack couples to resistor R259. The resistor R264 receives a signal from the output of the amplifier 102. The resistor R262 receives a signal directly from the chorus switch 50A. As indicated previously, the chorus switch 50A is ganged with the previously mentioned distortion switch 50. In the mid and left hand positions of the chorus switch as viewed in the diagram, the signal is taken from the chorus circuit to be described hereinafter and couples to both resistor 261 and resistor 262. It is noted that of these two resistors the resistor 261 has a higher resistance value.

In the left most position of the switch 50A the chorus is being fed to the mixer circuit. For this position the distortion switch 50 is feeding the output of the distortion circuit to the high and mid EQ circuits and also by way of network 52 to the line 55 and from there to the EQ mixer 94. In the mid position of the switch 50A the chorus input still couples to the mixer 105 but with regard to the distortion switch 50 the distortion action is shorted but the main signal is coupled by way of line 38 to the high, mid and low EQ circuits. In the right most position of the switch 50A the chorus signal is not coupled by way of the switch. Instead, the main signal from the amplifier 102 is coupled by way of resistor R256 via the switch 50A to the resistors R261 and R262. It is noted that the resistor values, such as the resistors R261 and R262 along with the resistors R264 and R264 are provided so that there is an equalization in this position of the switch so that the signals in both of the channels are not unbalanced.

The resistor R256 is instrumental in balancing the chorus signal with the main signal in the right most position of the switch 50A.

As previously mentioned, at the output of the mixers of channels 105A and 105B there are provided power amplifiers 107 and 109, respectively. The outputs of these amplifiers coupled to RC networks that provide the stability and furthermore include the capacitors for DC blockage. The outputs are taken at their respective jacks 115 and 116.

As indicated previously, the switch 50A is used to enable and disable the chorus section of the circuitry. In this regard note the lines 120 and 121 which couple to the chorus section. The line 120 couples from one side of resistor R256 to the low pass filter circuit 122. The line 121 couples from the switch 50A to the output of both filter 124 and filter 122 with both of these filters providing a mixing action essentially at the resistors R238 and R245 to be discussed in further detail hereinafter.

Thus, the line 120 couples into the low pass filter 122 which is comprised of an operational amplifier 125 and a series of resistors including input resistors R227 and R229 and input capacitors C207 and C208 which together provide the basic filtering action. There is also provided associated with the filter 122 resistors R225 and R226 which provide for gain control and Q determination. The output of the filter 122 at operational amplifier 125 couples to both resistor R245 for providing the mixing action and also couples by way of resistor R228 to an inverter 127 which is comprised of an inverting operational amplifier 128 having associated therewith a gain control resistor R230. The output of the amplifier 128 couples by way of resistor R232 and capacitor C211 to the band pass filter circuit 130. It is also noted that at one side of resistor R232 there is a line 131 including resistor R231 that couples back to the input of the low pass filter 122.

The inverter 127 provides for an inversion of the output of the filter 122. This output at resistor R232 is essentially mixed with the signal on line 131 and resistor R231 thus mixing the inverted low pass signal with the input signal on line 120 and providing on the output line 133 a high pass filter signal related to the output of the low pass filter 122.

The signal on the line 133 couples to the band pass filter 130 which is comprised of an operational amplifier 135 and basic filtering components including capacitors C209 and C210 along with resistors R234 and R235. At the ascertion input to the amplifier 135 it is noted that there is a DC offset circuit which includes resistor R233 and a diode D205. This offset is provided to compensate for a DC offset associated with the analog delay circuit 140. The circuit 140 provides the bucket brigade time delay. Associated with the circuit 140 is a resistor-capacitor network including resistors R246 and R269 and capacitor C215. This circuit provides for DC offset and for minimizing of distortion associated with the circuit.

The output from the circuit 140 is actually a dual output at lines 138A and 138B. These signals couple to a resistive ladder network which is comprised of resistors R239–R242 along with capacitors C214. Tnis circuit couples by way of line 142 to the input of the aforementioned low pass filter 124. The ladder network 144 minimizes the clock components associated with the circuit 140 by mixing the two signals on the lines 138A and 138B.

The control to the circuit 140 is from the flip-flop 145. In order to control the flip-flop 145 and in turn the circuit 140 there is provided a low frequency oscillator 150 which may be an oscillator with a period of two seconds. This oscillator includes operational amplifiers 151 and 152 along with associated resistors. These resistors include resistors R250–R255 and capacitor C220. There is also provided an LED 154 for providing an indication of the operability of the oscillator 150. The LED 154 serves as the basic pilot light for the unit. The output of the low frequency oscillator 150 at line 155 is used as a sweep frequency coupled by way of resistor R249 to the clock circuit 157. The clock circuit 157 includes a clock chip 158 and an R-C network 160 which is comprised of resistors R247 and R248 along with capacitors C217 and C218. The network 160 determines the timing characteristics of the clock chip 158. Of course, with the coupling of the low frequency oscillator output at line 155 also coupled to the chip 158 the frequency is swept at the rate of the low frequency oscillator 150. This swept frequency signal is coupled at the output line 162 of the clock 157 to the flip-flop 145. The ascertion and negation outputs of the flip-flop 145 coupled to the respective clock inputs of the circuit 140. The outputs from the flip-flop 145 are, of course, out of phase and the output signals on the lines 138A and 138B also have an out of phase clock component but by mixing these signals at the network 144 the out of phase clock signals cancel and thus the proper signal is provided at the output line 142.

Figure 5:
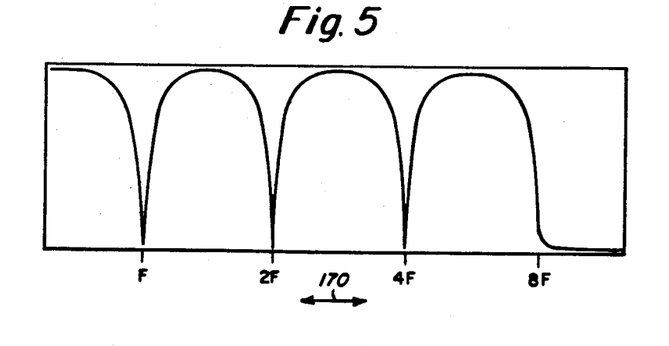
FIG. 5 is a frequency diagram relating to the comb filter shown in the detailed circuit diagram.

The signal on line 142 is thus the delayed analog signal having passed through the circuit 140 and has basically higher frequency components. As indicated previously, the signal to the circuit 140 is a function of the low pass filter 122 and in one disclosed embodiment the low pass filter passes signals only up to 160 Hz thus, the signal on line 142 has frequency components only over 160 Hz. This signal on line 142 couples to the aforementioned low pass filter 124 which provides high frequency de-emphasis so as to provide a flat frequency response. In this connection the aforementioned band pass filter 130 provided frequency pre-emphasis. Again, the output of the low pass filter 124 couples by way of resistor 238 and is mixed with the low pass output from filter 122 at resistor R245. This signal is coupled on line 121 back to the chorus switch 50A and is subsequently mixed with the main signal as discussed previously in connection with the output taken from the volume control circuit including the volume switch 100. It is noted that the signal on line 121 couples by way of jumper 51A and switch 50A and then to resistors R261 and R262. As indicated previously, these resistors are of different value thus providing a stereo effect because of the different ohmage of these resistors. It is also noted that the signal from the chorus circuit is mixed with the main signal; the main signal having been coupled to resistors R263 and R264. The mixing of these signals provides the waveform of FIG. 5 which indicates frequency cancellation at frequencies F, 2F, 4F and 8F. Also illustrated in FIG. 5 by the arrow 170 is the sweeping action discussed previously in connection with the low frequency oscillator 150 and associated clock 157. This sweeping action with the frequency response shown in FIG. 5 provides the chorus effect.

In accordance with the preferred detailed circuit just described there are a number of features that relate to the invention. For example, with regard to the chorus section of the circuitry, in the past the chorusing feature has been provided by frequency shifting essentially over a broad band width. However, in accordance with the improved chorus circuit of this invention there is used selective frequencies by means primarily of the filters 122 and 124 along with the inverter 128 and other parts of the circuit which are adapted to limit the amount of low frequency phase shift and thus make it easier to record on phonographic discs.

Another feature of the present invention is the use of a high frequency compressor in particular in association with the high frequency compressor switch for providing improved operation.

A further feature of the present inventon relates to the use of peak clipping circuitry for providing an instantaneous limiter. This has the effect of removing transients above some predetermined limit. This can be accomplished in several bands with recombination being used.

In accordance with still another feature of the present invention there is provided as a main means of detection rather than a straight forward peak detector, an RMS detector circuit. This is in particular compatible with a bass guitar. As previously mentioned, ordinarily a peak detector would be used. However, because this is a low frequency bass device the peak detector does not operate effectively because of the existence of cancellation or beating effects that could cause undesired peak detections. With the use of the RMS detector of this invention this is eliminated.

Still another feature of the present invention is the use of a distortion switch in which pre-equalization occurs before distorting.

In addition there are other features in the invention that will be recognized from the aforementioned circuitry and associated description thereof.

What is claimed is:

1. An electronic audio signal system for processing signals in the audio frequency range and comprising, input circuit means for receiving the audio signal, filter means cmprising separate high EQ, mid EQ and low EQ filter circuits, said input circuit means coupling to said filter means, EQ switch means coupled from the output of said low, mid and high EQ filter circuits for selectively establishing multiple frequency response waveforms, and output circuit means coupled from said EQ switch means, said input circuit means comprising a compressor, a sustain control switch means and a detector means comprising an RMS detector, and a feedback loop between the input and the output of the compressor including in the feedback loop said RMS detector and said sustain control switch means.

2. An electronic audio signal system as set forth in claim 1 including a low pass filter coupled between the output of the compressor and the RMS detector for attenuating high frequency signals.

3. An electronic audio signal system as set forth in claim 1 wherein said compressor comprises a compressor operational amplifier.

4. An electronic audio signal system as set forth in claim 3 including a filter coupled between the output of the compressor op amp and the RMS detector.

5. An electronic audio signal system as set forth in claim 1 wherein said input circuit means further comprises a distortion amplifier and a distortion switch coupled to the distortion amplifier.

6. An electronic audio signal system as set forth in claim 5 further including a chorus switch having a pole mechanically coupled to the distortion switch.

7. An electronic audio signal system for processing signals in the audio frequency range and comprising, input circuit means for receiving the audio signal, filter means comprising separate high EQ, mid EQ and low EQ filter circuits, said input circuit means coupling to said filter means, EQ switch means coupled from the output of said low, mid and high EQ filter circuits for selectively establishing multiple frequency response waveforms, and output circuit means coupled from said EQ switch means, and said EQ switch having three positions and having its output coupled to a first mixer, a volume control switch at the output of the first mixer, a chorus circuit and associated chorus switch, said output circuit means comprising a second mixer having two mixer channels one channel receiving a signal from said chorus circuit, the other channel receiving a signal coupled from the first mixer via the volume control switch.

8. An electronic audio signal system as set forth in claim 7 wherein said chorus circuit includes filter means for providing selective frequencies and includes inverter means.

9. An electronic audio signal system for processing signals in the audio frequency range and comprising, input circuit means including a first compressor for receiving the audio signal, filter means comprising separate high EQ, mid EQ and low EQ filter circuits, said input circuit means coupling to said filter means, EQ switch means coupled from the output of said low, mid and high EQ filter circuits for selectively establishing multiple frequency response waveforms, and output circuit means coupled from said EQ switch means including a second compressor responsive only to the output of said high EQ filter means and a high frequency compressor switch for controlling said second compressor.

10. An electronic audio signal system for processing signals in the audio frequency range and comprising, input circuit means for receiving the audio signal, filter means comprising separate high EQ, mid EQ and low EQ filter circuits, said input circuit means coupling to said filter means, EQ switch means coupled from the output of said low, mid and high EQ filter circuits for selectively establishing multiple frequency response waveforms, and output circuit means coupled from said EQ switch means, and said output circuit means including a clipping circuit responsive only to the output of the high EQ filter circuit.

11. An electronic audio signal system as set forth in claim 10 wherein said clipping circuit includes a clip switch adapted to provide different voltage levels of clipping.

12. An electronic audio signal system as set forth in claim 11 wherein said high EQ filter circuit comprises a plurality of separate filters.

13. An electronic audio signal system for processing signals in the audio frequency range and comprising input circuit means for receiving an audio signal, filter means comprising separate high EQ, mid EQ, and low EQ filter circuits, said input circuit means coupled to said filter means, EQ switch means coupled from the output of said low, mid, and high EQ filter circuits for selectively establishing multiple frequency responce waveforms, and output circuit means coupled from said EQ switch means, and further including a clipping circuit responsive only to the output of the high EQ filter circuit.

14. An electronic audio signal system for processing signals in the audio frequency range and comprising, input circuit means for receiving the audio signal, filter means comprising separate high EQ, mid EQ and low EQ filter circuits, said input circuit means coupling to said filter means, EQ switch means coupled from the output of said low, mid and high filter circuits for selectively establishing multiple frequency response waveforms, output circuit means coupled from said switch means, said input circuit input means comprising a compressor, a distortion amplifier and a distortion switch coupled to the distortion amplifier, said output circuit means comprising a clipping circuit responsive only to the output of the high EQ filter circuit wherein said clipping circuit includes a clip switch adapted to provide different voltage levels of clipping and a mixer coupled from said clipping circuit.

15. An electronic audio signal system as set forth in claim 14 including a chorus switch mechanically coupled to the distortion switch and said cmpressor including a feedback loop including an RMS detector and a sustain switch in the feedback loop.

16. An electronic audio signal system as set forth in claim 15 including a clip circuit at the input to the low EQ filter circuit wherein said low EQ filter circuit comprises a plurality of separate filters.

17. An electronic audio signal system as set forth in claim 16 wherein said EQ switch has three positions and has its output coupled to said mixer and further including a volume control switch at the output of the mixer, a chorus circuit, and chorus switch coupled from the volume control switch and wherein said chorus circuit includes filter means for providing selective frequencies and including inverter means.

* * * * *